United States Patent
Tsuchimoto

(10) Patent No.: US 7,063,267 B2
(45) Date of Patent: Jun. 20, 2006

(54) PORTABLE ELECTRONIC DEVICE

(75) Inventor: Yuuji Tsuchimoto, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/947,399

(22) Filed: Sep. 23, 2004

(65) Prior Publication Data

US 2005/0082374 A1  Apr. 21, 2005

(30) Foreign Application Priority Data

Sep. 26, 2003 (JP) ............................. 2003-336213
Mar. 26, 2004 (JP) ............................. 2004-092539

(51) Int. Cl.
  *G06K 19/06* (2006.01)
(52) U.S. Cl. ..................... 235/492; 235/441; 235/487
(58) Field of Classification Search ................ 235/492, 235/441, 487; 361/737; 438/106, 112, 125, 438/459

See application file for complete search history.

(56) References Cited

U.S. PATENT DOCUMENTS

| | | | | |
|---|---|---|---|---|
| 4,727,246 A | * | 2/1988 | Hara et al. | 235/488 |
| 4,876,441 A | * | 10/1989 | Hara et al. | 235/488 |
| 5,155,068 A | * | 10/1992 | Tada | 438/125 |
| 5,264,990 A | | 11/1993 | Venambre | 361/761 |
| 5,786,988 A | | 7/1998 | Harari | 361/749 |
| 5,849,230 A | * | 12/1998 | Murohara | 264/138 |
| 5,851,902 A | * | 12/1998 | Sakai | 438/459 |
| 5,854,819 A | * | 12/1998 | Hara et al. | 378/34 |
| 6,031,724 A | * | 2/2000 | Takahashi | 361/737 |
| 6,166,914 A | * | 12/2000 | Sugiyama et al. | 361/737 |
| 6,506,664 B1 | * | 1/2003 | Beyne et al. | 438/455 |
| 6,607,135 B1 | * | 8/2003 | Hirai et al. | 235/487 |
| 6,642,082 B1 | * | 11/2003 | Yamaguchi et al. | 438/112 |

FOREIGN PATENT DOCUMENTS

| | | |
|---|---|---|
| EP | 0 919 950 A1 | 6/1999 |
| EP | 0 939 379 A1 | 9/1999 |
| EP | 0 952 545 A1 | 10/1999 |
| FR | 2 799 857 | 4/2001 |
| JP | 6-199084 | 7/1994 |
| JP | 11085937 A | * 3/1999 |
| JP | 2002366918 A | * 12/2002 |

OTHER PUBLICATIONS

European Search Report dated May 23, 2005 for Appln. No. EP 04 02 2678.

* cited by examiner

*Primary Examiner*—Uyen-Chau N Le
(74) *Attorney, Agent, or Firm*—Pillsbury Winthrop Shaw Pittman, LLP

(57) ABSTRACT

A portable electronic device includes a card base having a holding recess and an IC module having a substrate, an LSI mounted on the substrate, and a protection member which covers the LSI. The IC module is held in the holding recess from the protection member. The portable electronic device further includes a reinforcing projection that is formed along the circumference of the surface of the protection member which faces the inner bottom of the holding recess.

15 Claims, 15 Drawing Sheets

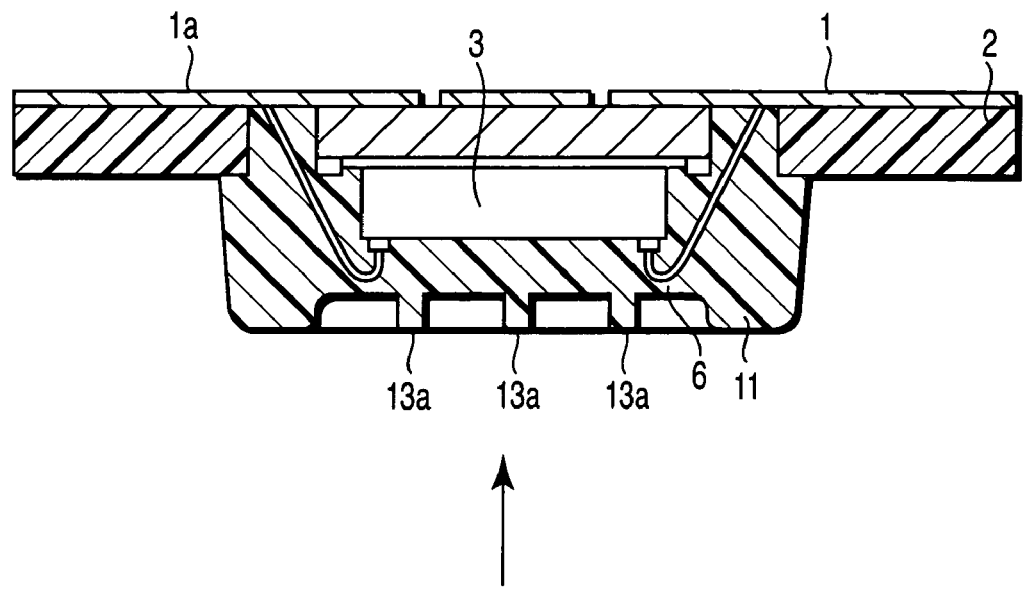
F I G. 9
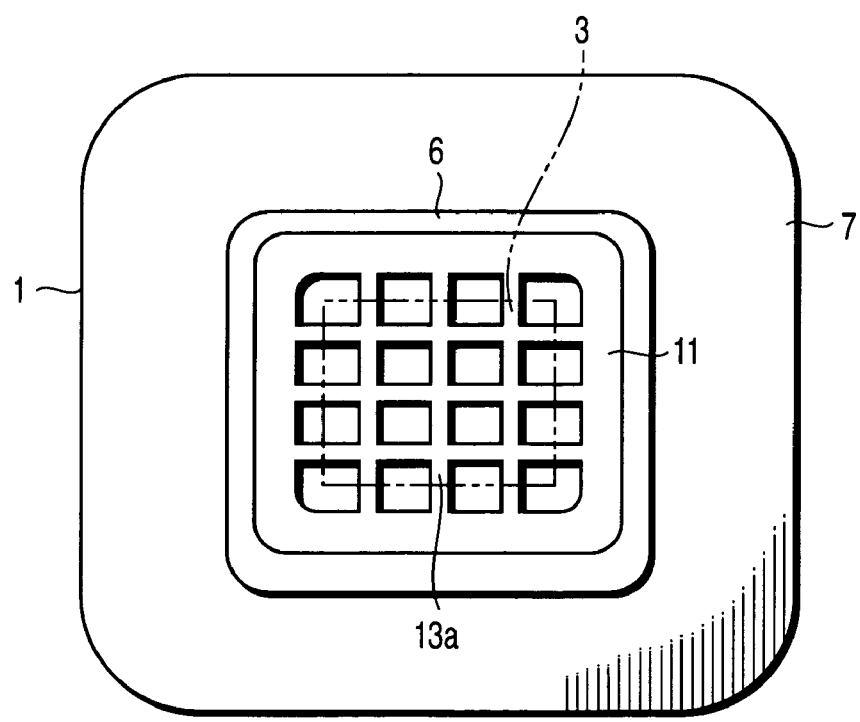
F I G. 10

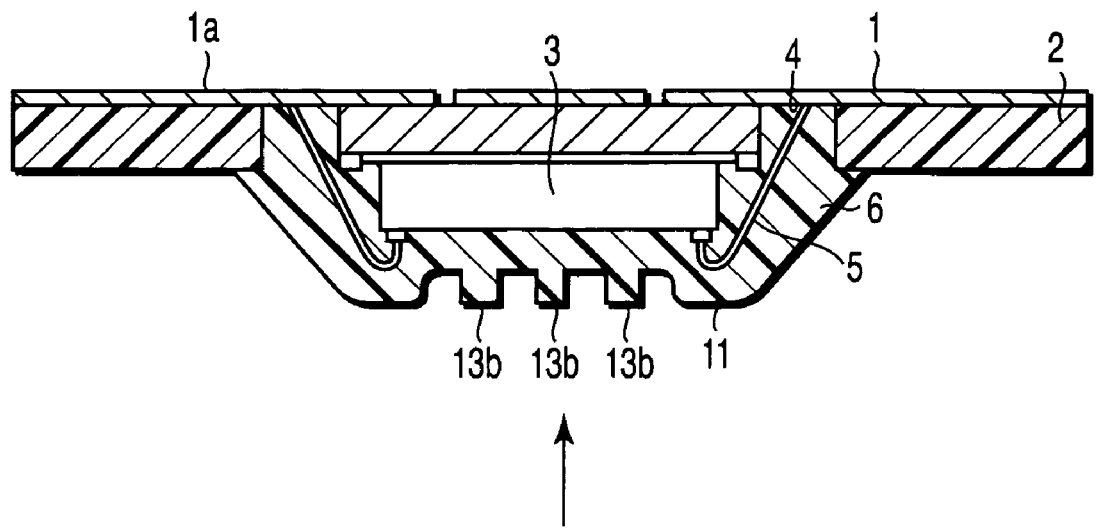
F I G. 13
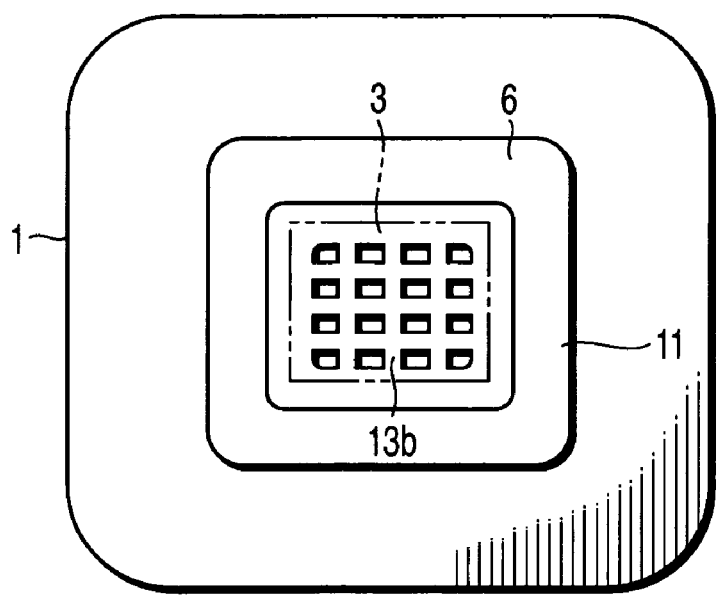
F I G. 14

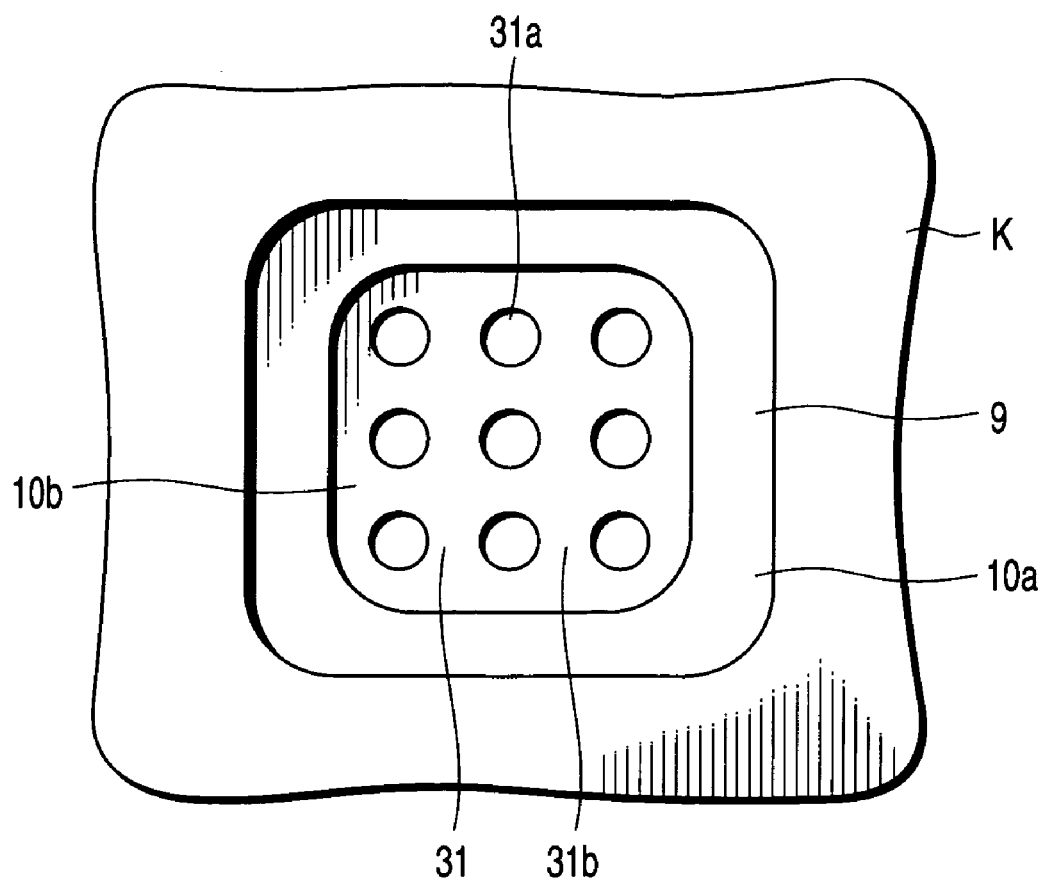
F I G. 15A
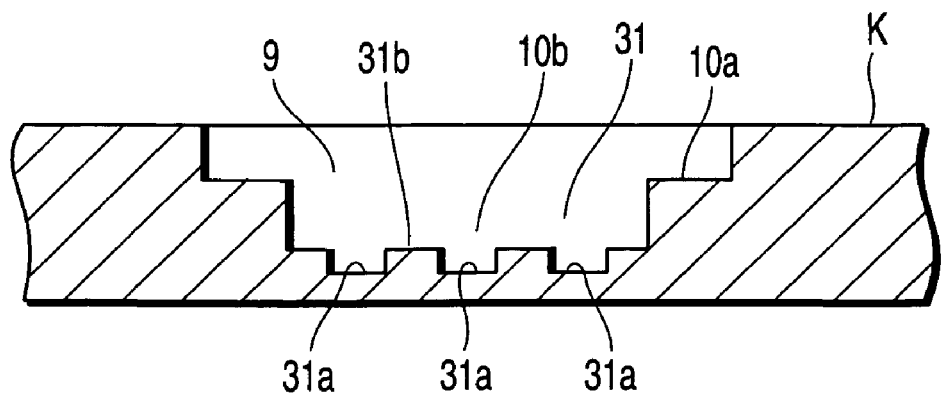
F I G. 15B

PORTABLE ELECTRONIC DEVICE

CROSS-REFERENCE TO RELATED APPLICATIONS

This application is based upon and claims the benefit of priority from prior Japanese Patent Applications No. 2003-336213, filed Sep. 26, 2003; and No. 2004-092539, filed Mar. 26, 2004, the entire contents of both of which are incorporated herein by reference.

BACKGROUND OF THE INVENTION

1. Field of the Invention

The present invention relates to a portable electronic device such as an IC card that is improved in IC module and IC module holding recess.

2. Description of the Related Art

An IC module for IC cards as shown in FIGS. 26 and 27 is known. FIG. 26 is a sectional view of the IC module and FIG. 27 is a diagram of the IC module viewed from the arrow in FIG. 26.

In FIGS. 26 and 27, reference numeral 21 indicates a substrate. The substrate 21 has an external terminal 21a on one side and an LSI 23 on the other side. The external terminal 21a has a terminal 24. The terminal 24 is opposed to a hole 21b formed in the substrate 21. The terminal 24 and LSI 23 are electrically connected to each other through gold wire 25 as a connection member. The LSI 23 and gold wire 25 are covered with a resin-made protection member 26 to be protected from external pressure. The IC module so configured is held and fitted into a holding recess formed in a card base.

However, conventionally, the protection member 26 is hemispherically formed and its central part is increased in thickness; therefore, it does not present strength problems but the following problem.

When the central part of the protection member 26 is thick, if the card base of the IC card is also thick, no problems occur. In this case, however, the card base is often thin. If, therefore, the protection member 26 is thick, the IC module cannot be held in the holding recess.

If the holding recess of the card base is formed deeply to excess, the IC module can be held therein. However, the inner bottom of the holding recess is thinned and cracked if a load is repeatedly applied to the card base.

To resolve the above problem, the protection member 26 of the LSI 23 can be formed to have a trapezoidal section and thus decrease in thickness, as shown in FIGS. 28 and 29. In this case, however, the following problems occur. The IC module in itself decreases in strength. If an external pressure such as bending and torsion is repeatedly applied to the IC card, the LSI 23 is destroyed or the gold wire 25 becomes poor in connection to thereby cause a malfunction.

Conventionally, the inner bottom of the holding recess of the card base is flattened. If an external pressure such as bending and torsion is applied to the IC card, stress is concentrated on the inner bottom of the holding recess. This concentration of stress causes problems that the card base is destroyed and the IC module is broken.

BRIEF SUMMARY OF THE INVENTION

The present invention has been developed in consideration of the above situation and an object thereof is to provide a portable electronic device in which an IC module or a card base is not destroyed even though an external pressure such as bending and torsion is applied to an IC card.

A portable electronic device according to a first aspect of the present invention, comprises a card base having a holding recess; an IC module having a substrate, an LSI mounted on the substrate, and a protection member which covers the LSI, the IC module being held in the holding recess from the protection member; and a reinforcing projection that is formed along a circumference of a surface of the protection member which faces an inner bottom of the holding recess.

A portable electronic device according to a second aspect of the present invention, comprises a card base having a holding recess; an IC module having a substrate, an LSI one surface of which is mounted on one surface of the substrate, a contact terminal provided on other surface of the substrate, a connection member one end of which is electrically connected to the contact terminal and other end of which is electrically connected to other surface of the LSI to form a loop, and a protection member which covers the LSI and the connection member, the IC module being held in the holding recess of the card base from the protection member; and a reinforcing projection that is formed along a circumference of a surface of the protection member which faces an inner bottom of the holding recess to cover the loop of the connection member.

A portable electronic device according to a third aspect of the present invention, comprises a card base having a first holding recess, a second holding recess formed in an inner bottom of the first holding recess, and an irregularity portion formed in an inner bottom of the second holding recess; and an IC module having a substrate, an LSI mounted on the substrate, and a protection member which covers the LSI, the substrate being held in the first holding recess and the protection member being inserted in the second holding recess.

A portable electronic device according to a fourth aspect of the present invention, comprises a card base having a first holding recess, a second holding recess formed in an inner bottom of the first holding recess, and an irregularity portion formed in an inner bottom of the second holding recess; an IC module having a substrate, an LSI mounted on the substrate, and a protection member which covers the LSI, the substrate being held in the first holding recess and the protection member being inserted in the second holding recess; and a reinforcing projection that is formed along a circumference of a surface of the protection member which faces the inner bottom of the second holding recess, the irregularity portion having a projection which is inserted inside the reinforcing projection.

Additional advantages of the invention will be set forth in the description which follows, and in part will be obvious from the description, or may be learned by practice of the invention. The advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 9 is a sectional view of an IC module according to a third embodiment of the present invention, which is mounted on the IC card.

FIG. 10 is a diagram of the IC module viewed from the arrow in FIG. 9.

FIG. 13 is a sectional view of an IC module according to a fifth embodiment of the present invention, which is mounted on the IC card.

FIG. 14 is a diagram of the IC module viewed from the arrow in FIG. 13.

FIG. 15A is a plan view showing a first modification to the holding recess of the card base of the IC card.

FIG. 15B is a sectional side view of the holding recess shown in FIG. 15A.

DETAILED DESCRIPTION OF THE INVENTION

Embodiments of the present invention will be described below with reference to the accompanying drawings.

Figure 1:
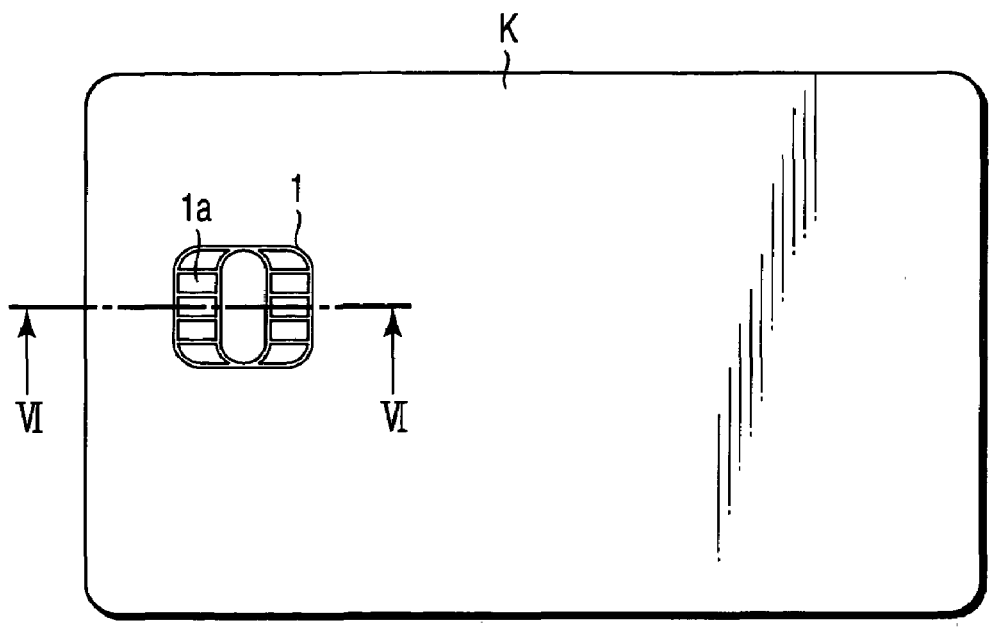
FIG. 1 is a plan view showing an IC card according to an embodiment of the present invention.

FIG. 1 is a plan view showing an IC card according to an embodiment of the present invention as a portable electronic device. The IC card includes a card base K and an IC module 1 mounted on the card base K.

Figure 2:
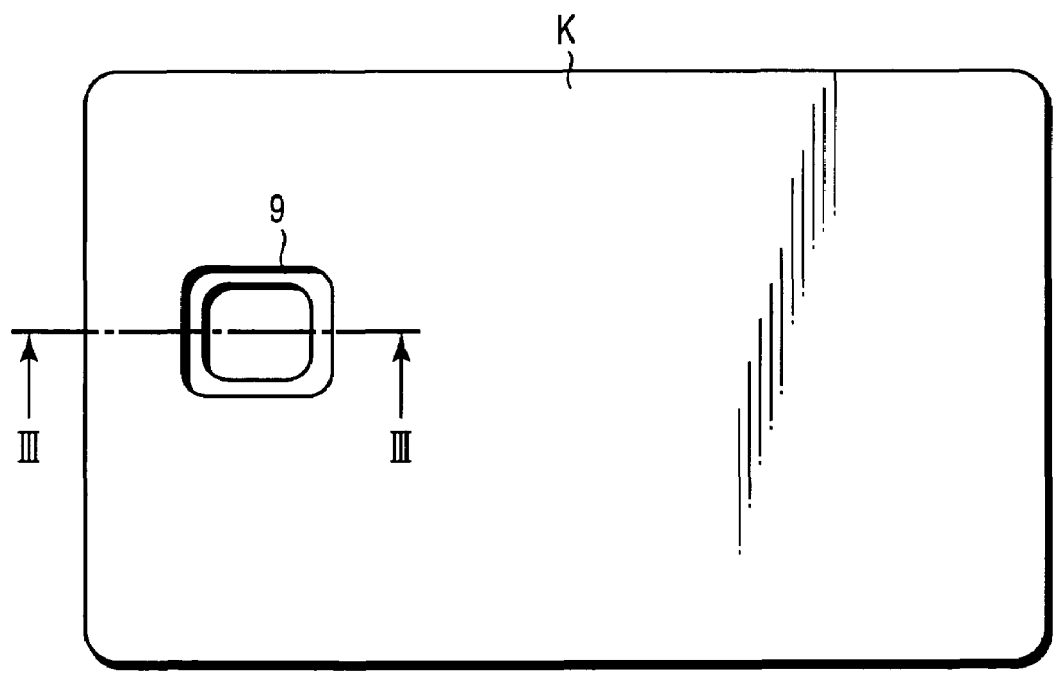
FIG. 2 is a plan view showing a card base of the IC card.
Figure 3:
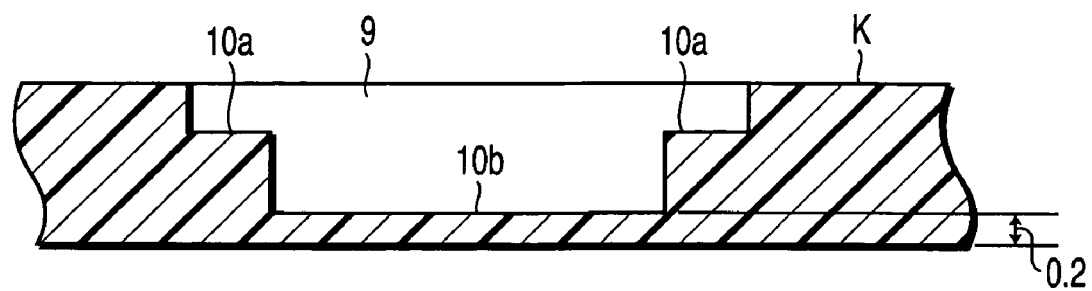
FIG. 3 is a sectional view taken along line B—B in FIG. 2.

FIG. 2 is a plan view of the card base K from which the IC module 1 is detached. FIG. 3 is a sectional view taken along line B—B in FIG. 2.

The card base K has a holding recess 9 that holds the IC module 1. The holding recess 9 includes a first holding recess 10*a* that holds a collar section 7 (described later) of the IC module 1 and a second holding recess 10*b* that holds a resin-made protection member 6 that covers an LSI 3 (described later).

Figure 4:
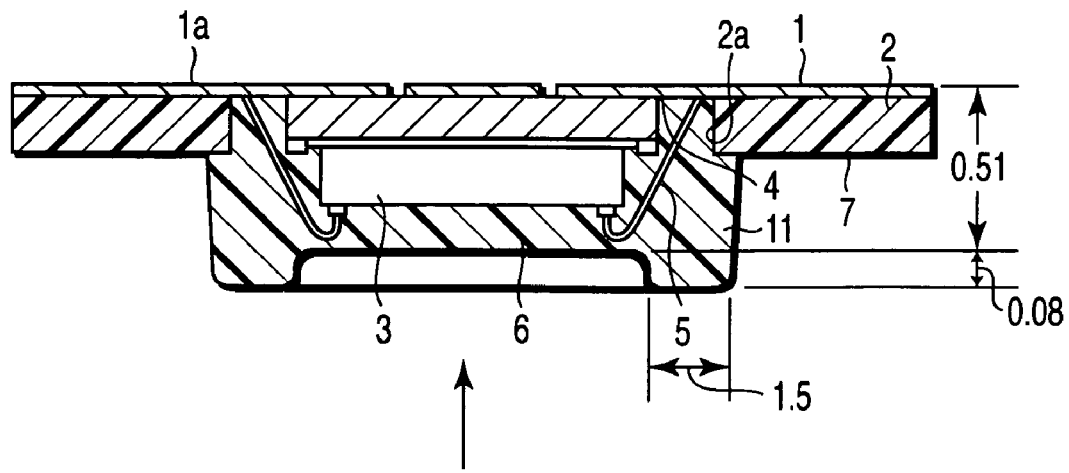
FIG. 4 is a sectional view of an IC module according to a first embodiment of the present invention, which is mounted on the IC card.
Figure 5:
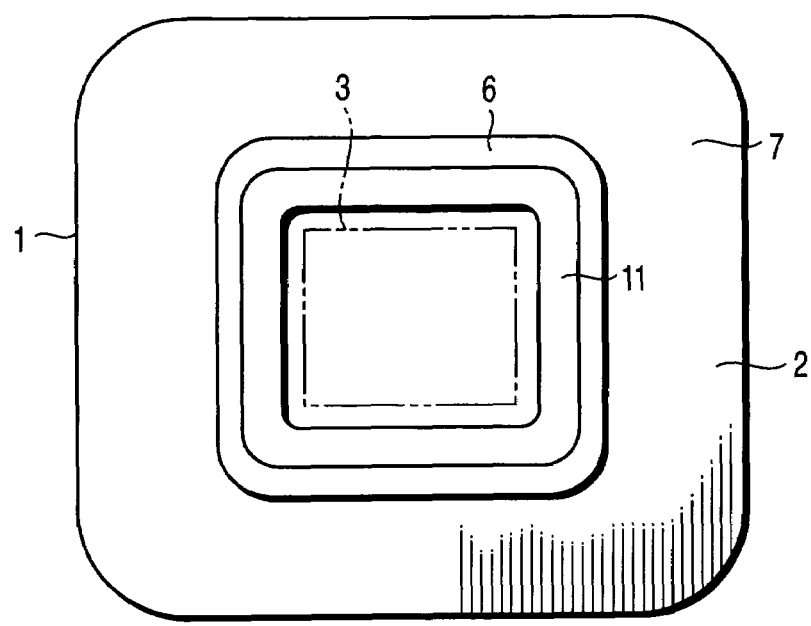
FIG. 5 is a diagram of the IC module viewed from the arrow in FIG. 4.
Figure 6:
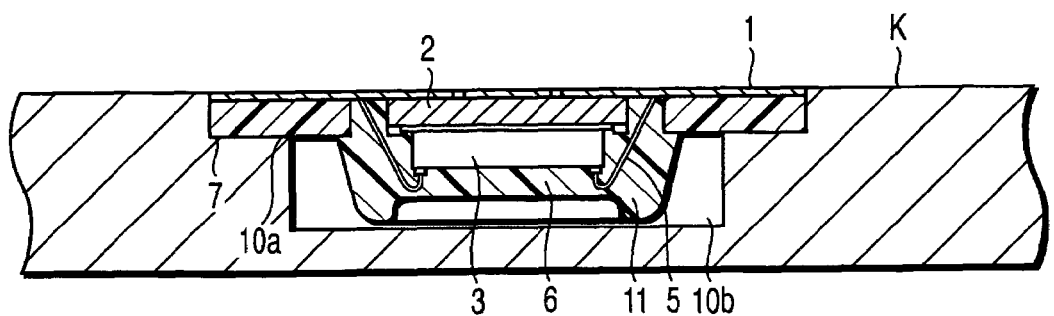
FIG. 6 is a sectional view taken along line A—A in FIG. 1.

FIG. 4 is a sectional view showing an IC module 1 according to a first embodiment of the present invention. FIG. 5 is a diagram of the IC module 1 viewed from the arrow in FIG. 4.

The IC module 1 includes a substrate 2. The substrate 2 has a contact terminal 1*a* on one side and the LSI 3 on the other side. The LSI 3 becomes communicable when the contact terminal 1*a* contacts an external terminal. The contact terminal 1*a* has a terminal 4. The terminal 4 is opposed to a hole 2*a* formed in the substrate 2. The terminal 4 and LSI 3 are electrically connected to each other through gold wire 5 of a connection member. The periphery of the LSI 3 is covered with a resin-made protection member 6. The protection member 6 protects the LSI 3 and gold wire 5 from external pressure. The periphery of the protection member 6 in the substrate 2 serves as a collar section 7.

A rectangular frame-like reinforcing rib 11 is formed as a reinforcing projection along the circumference of the undersurface of the protection member in FIG. 4. The reinforcing rib 11 is integrated with the protection member 6 as one component.

The IC module 1 so configured is inserted into the holding recess 9 of the card base K from the protection member 6 and held therein. In other words, the protection member 6 that covers the LSI 3 is held in the second holding recess 10*b* that is formed deeply, while the collar section 7 is held in the first holding recess 10*a* that is formed shallowly.

As described above, the reinforcing rib 11 is formed on the undersurface of the protection member 6 integrally with each other as one component. It can therefore receive bending stress of the IC card to increase the strength of the IC card against bending. Consequently, the IC card can be improved in reliability by lessening the drawbacks of poor connection of the gold wire 5 and damage to the LSI 3.

TABLE 1

RESULTS OF STRENGTH TESTS

| Contents of Evaluation | | Card No. | Shape of Prior Art Plane Breaking Load (N) | Shape of Present Embodiment Formed Rib Breaking Load (N) |
|---|---|---|---|---|
| Evaluation ① | Bending Test on Module Alone | 1 | 11.93 | 13.14 |
| | | 2 | 11.14 | 13.28 |
| | | 3 | 11.56 | 13.28 |
| | | Average | 11.54 | 13.23 |

Figure 28:
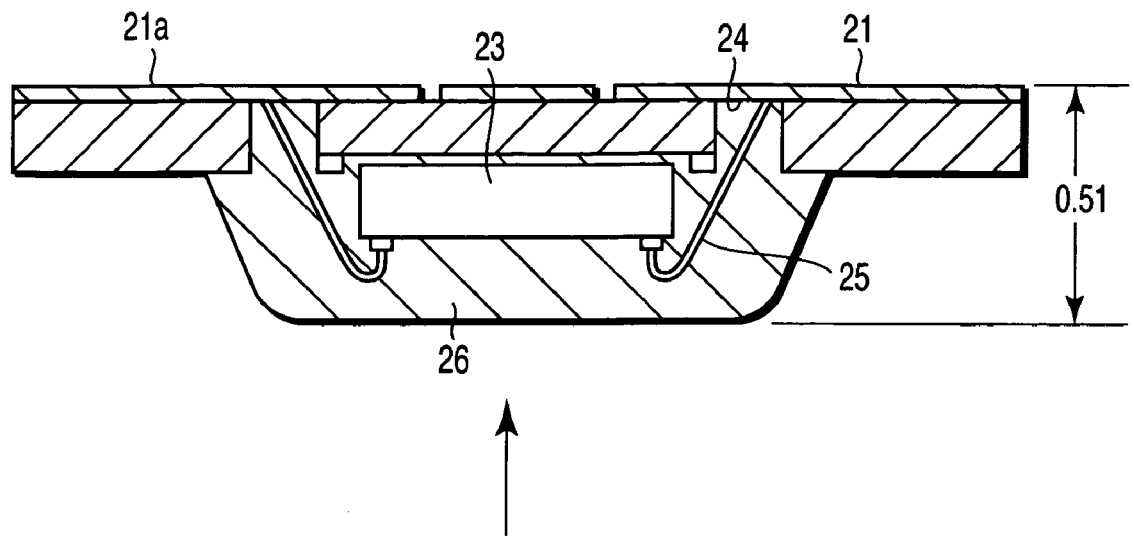
FIG. 28 is a sectional view showing a second prior art IC module.
Figure 29:
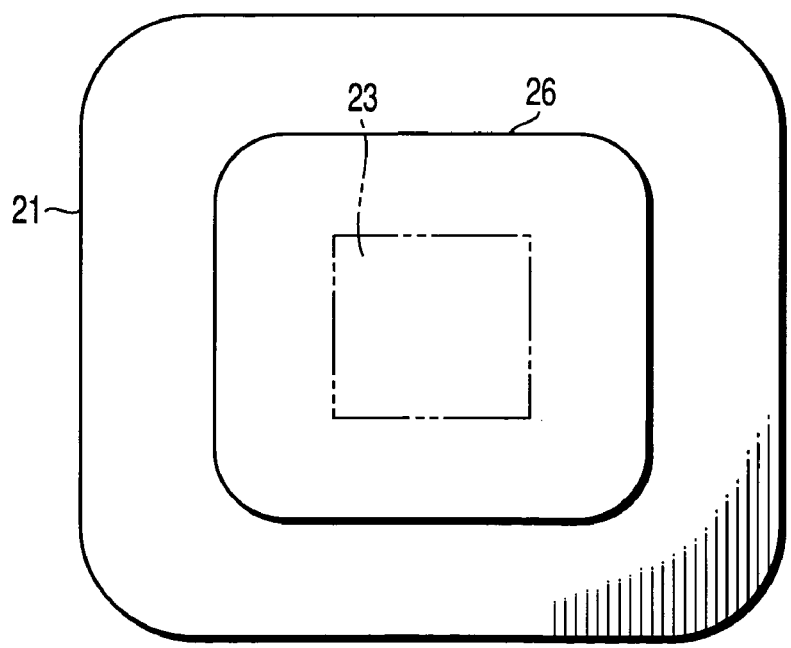
FIG. 29 is a diagram of the second prior art IC module viewed from the arrow in FIG. 28.

Table 1 shows results of bending strength tests on the prior art IC module 21 shown in FIG. 28 and the IC module 1 of the present embodiment shown in FIG. 4. The thickness of the prior art IC module 21 is 0.51 mm, while the thickness of the IC module 1 is 0.51 mm, the height of the reinforcing rib 11 of the IC module 1 is 0.08 mm, and the width thereof is 1.5 mm.

Three tests on each of the IC modules 21 and 1 were conducted and an average of the tests was taken. The breaking load of the prior art IC module 21 in the first test was 11.93N, that in the second test was 11.56N and that in the third test was 11.54N, and the average of these breaking loads was 11.54N. On the other hand, the breaking load of the IC module 1 in the first test was 13.14N, that in the second test was 13.28N and that in the third test was 13.28N, and the average of these breaking loads was 13.23N.

As is evident from the above results, the IC module 1 shown in FIG. 4 is more improved in strength than the prior art IC module 21 shown in FIG. 28.

Figure 7:
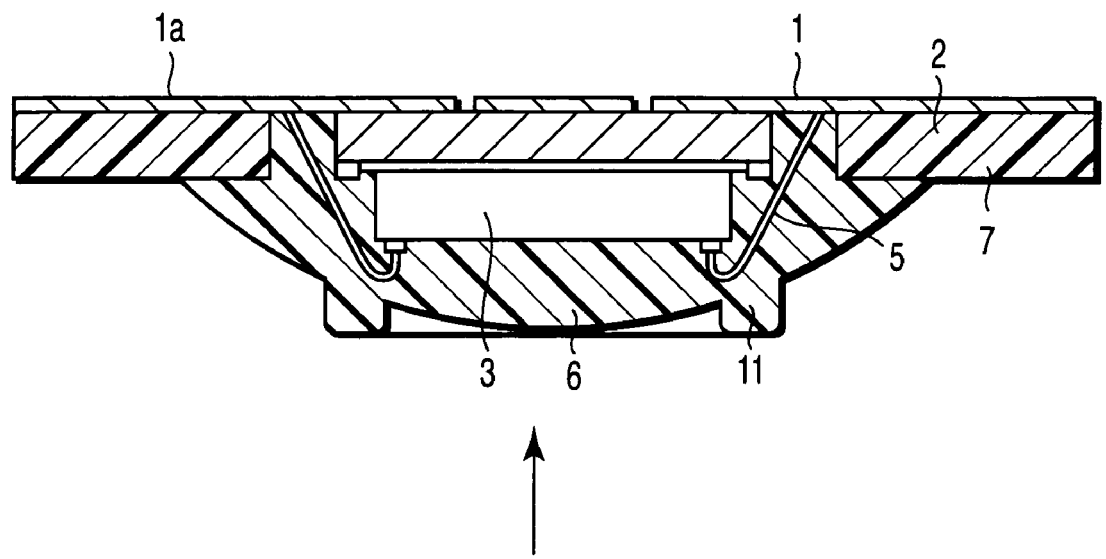
FIG. 7 is a sectional view of an IC module according to a second embodiment of the present invention, which is mounted on the IC card.
Figure 8:
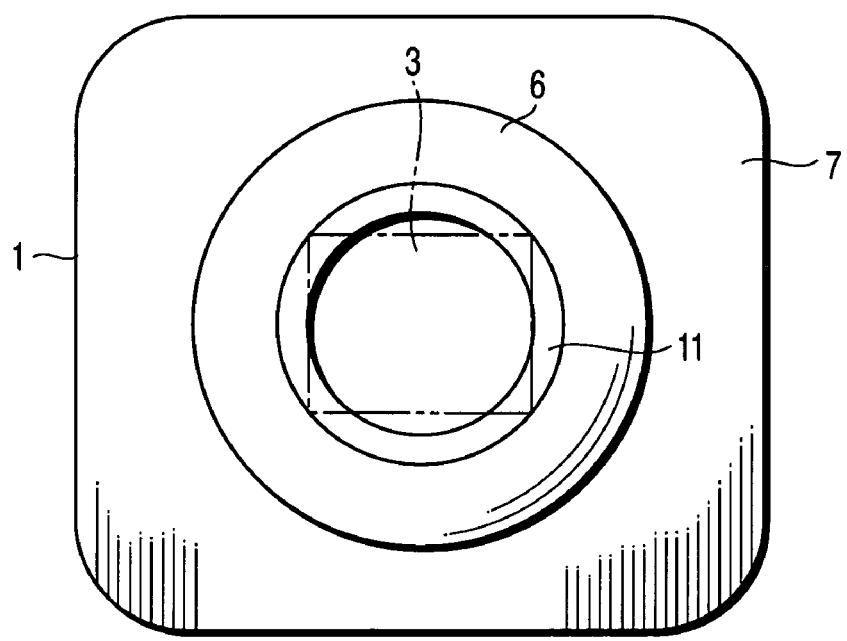
FIG. 8 is a diagram of the IC module viewed from the arrow in FIG. 7.

FIG. 7 is a sectional view showing an IC module 1 according to a second embodiment of the present invention. FIG. 8 is a diagram of the IC module 1 viewed from the arrow in FIG. 7. The same components as those of the IC module according to the first embodiment are denoted by the same reference numerals and their descriptions are omitted.

In the second embodiment, a protection member 6 for protecting an LSI 3 is hemispherically shaped. A circular reinforcing rib 11 is formed on the surface of the protection member 6 as a circular reinforcing projection. The reinforcing rib 11 is integrated with the protection member 6 as one component. The second embodiment can produce the same advantages as those of the first embodiment.

FIG. 9 is a sectional view showing an IC module 1 according to a third embodiment of the present invention. FIG. 10 is a diagram of the IC module 1 viewed from the arrow in FIG. 9. The same components as those of the IC module according to the first embodiment are denoted by the same reference numerals and their descriptions are omitted.

The IC module 1 of the third embodiment has a rectangular frame-like reinforcing rib 11 on the undersurface of a protection member 6 that protects an LSI 3, like that of the first embodiment. The IC module 1 also has a reinforcing rib 13a on the undersurface of the protection member 6 as a lattice-like reinforcing projection. The reinforcing rib 13a is located inside the reinforcing rib 11 and integrated with the protection member 6 as one component. The lattice-like reinforcing rib 13a can increase the strength of the module 1 against the bending of a card further and decrease the drawbacks of poor connection of gold wire 5 and damage to the LSI 3 to improve the reliability of the card further.

The IC module of the first embodiment is disadvantageous when a load is concentrated on a relatively thin portion of the protection member 6 inside the rectangular frame-like reinforcing rib 11. In the third embodiment, however, the lattice-like reinforcing rib 13a is formed on a thin portion of the protection member 6. The IC card is therefore strengthened against concentrated load as well as bending and improved in reliability.

Figure 11:
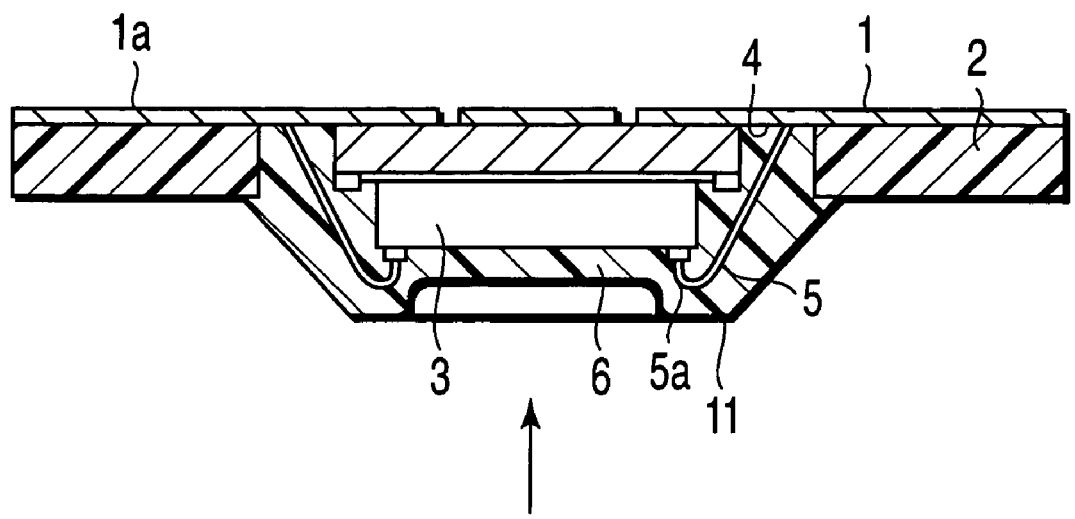
FIG. 11 is a sectional view of an IC module according to a fourth embodiment of the present invention, which is mounted on the IC card.
Figure 12:
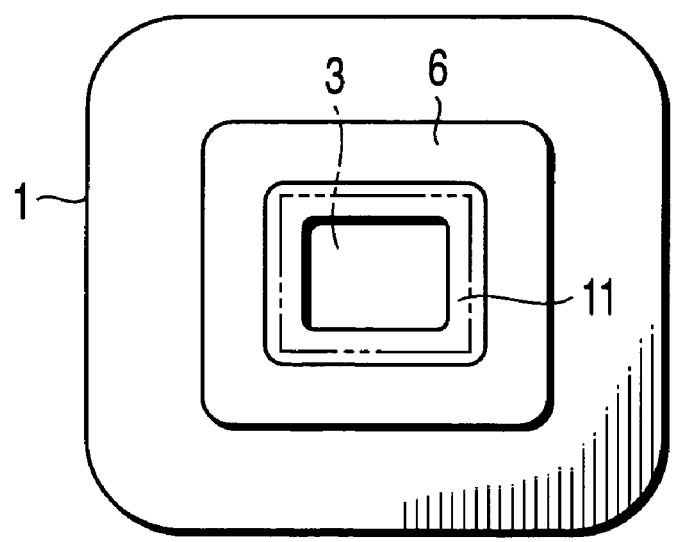
FIG. 12 is a diagram of the IC module viewed from the arrow in FIG. 11.

FIG. 11 is a sectional view showing an IC module 1 according to a fourth embodiment of the present invention. FIG. 12 is a diagram of the IC module 1 viewed from the arrow in FIG. 11. The same components as those of the IC module according to the first embodiment are denoted by the same reference numerals and their descriptions are omitted.

In the fourth embodiment, gold wire 5 that connects an LSI 3 and a terminal 4 is formed like a loop under the LSI 3. Usually, the undersurface of the LSI 3 is flat. In order to connect the gold wire 5 to the flat undersurface of the LSI 3, a loop portion 5a of the gold wire 5 projects downward from the undersurface of the LSI 3.

In the fourth embodiment, a rectangular frame-like reinforcing rib 11 is formed to cover the most projected loop portion 5a of the gold wire 5. The protection member 6 inside the reinforcing rib 11 need not be thickened more than the amount of projection of the loop portion 5a and accordingly the IC module 1 can be thinned. Consequently, the inner bottom of a holding recess 9 of a card base K can be thickened to decrease damage to the card base K even though a load is applied to the card base K.

FIG. 13 is a sectional view showing an IC module 1 according to a fifth embodiment of the present invention. FIG. 14 is a diagram of the IC module 1 viewed from the arrow in FIG. 13. The same components as those of the IC module according to the fourth embodiment are denoted by the same reference numerals and their descriptions are omitted.

In the fifth embodiment, a lattice-like reinforcing rib 13b is formed as a projection on the undersurface of a protection member 6 inside a frame-like reinforcing rib 11 as shown in the fourth embodiment. The reinforcing rib 13b is integrated with the protection member 6 as one component.

The fifth embodiment can produce the same advantages as those of the fourth embodiment. The lattice-like reinforcing rig 13b strengthens the IC card against concentrated load as well as bending to thereby improve the reliability of the IC card.

The shape of the above-described reinforcing ribs 11, 13a and 13b is not limited to a rectangular frame, a circular frame or a lattice. The ribs can be shaped like a single line or a cross.

FIG. 15A is a plan view of a first modification to the holding recess 9 of the card base K and FIG. 15B is a sectional view of the first modification.

The holding recess 9 of the first modification has an irregularity portion 31 in the inner bottom of the second holding recess 10b. The irregularity portion 31 includes a plurality of circular recesses 31a that are vertically and horizontally formed in the inner bottom of the second holding recess 10b and projections 31b that are formed in accordance with the recesses 31a.

According to the first modification, even though stress is generated at the inner bottom of the second holding recess 10b by applying a great external pressure such as bending and torsion to the card base K, it can be dispersed by the irregularity portion 31 to prevent the card base K from being broken and prevent the IC module 1 from being destroyed.

Figure 16:
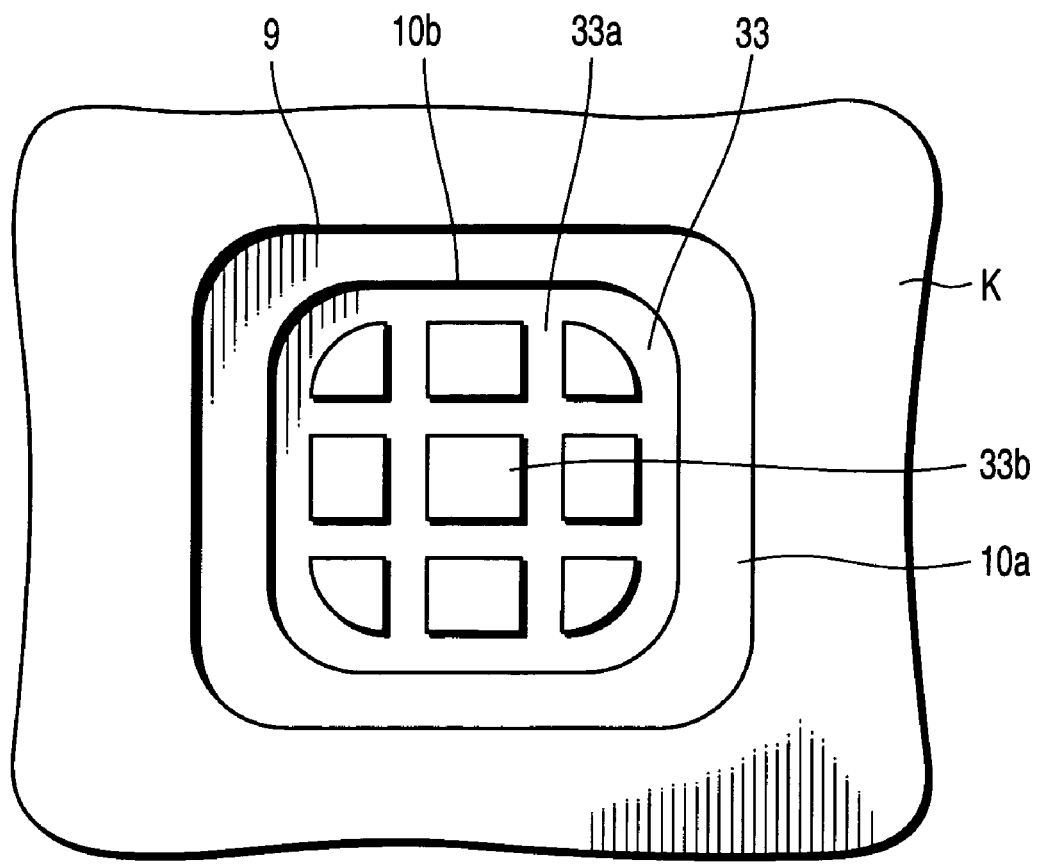
FIG. 16 is a plan view showing a second modification to the holding recess of the card base.
Figure 17:
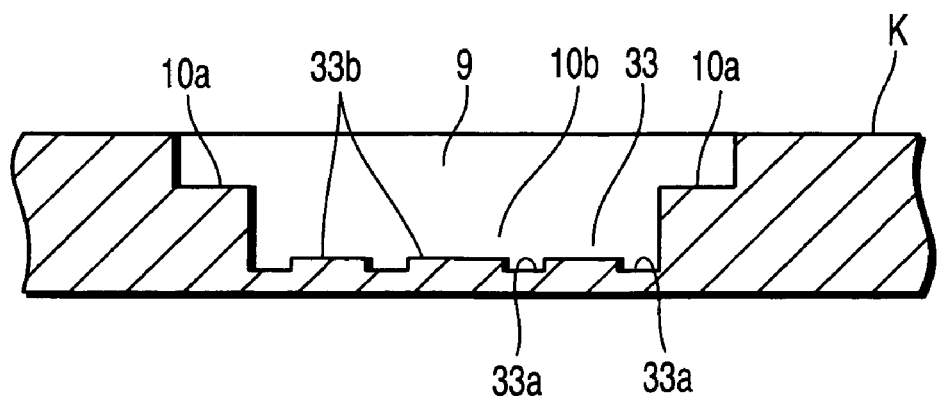
FIG. 17 is a sectional side view of the second modification to the holding recess.

FIG. 16 is a plan view of a second modification to the holding recess 9 of the card base K and FIG. 17 is a sectional view of the second modification.

The holding recess 9 of the second modification has an irregularity portion 33 in the inner bottom of the second holding recess 10b. The irregularity portion 33 includes recesses 33a that are formed like a lattice and a plurality of projections 33b that are formed in accordance with the recesses 33a.

The second modification can also produce the same advantages as those of the first modification.

Figure 18:
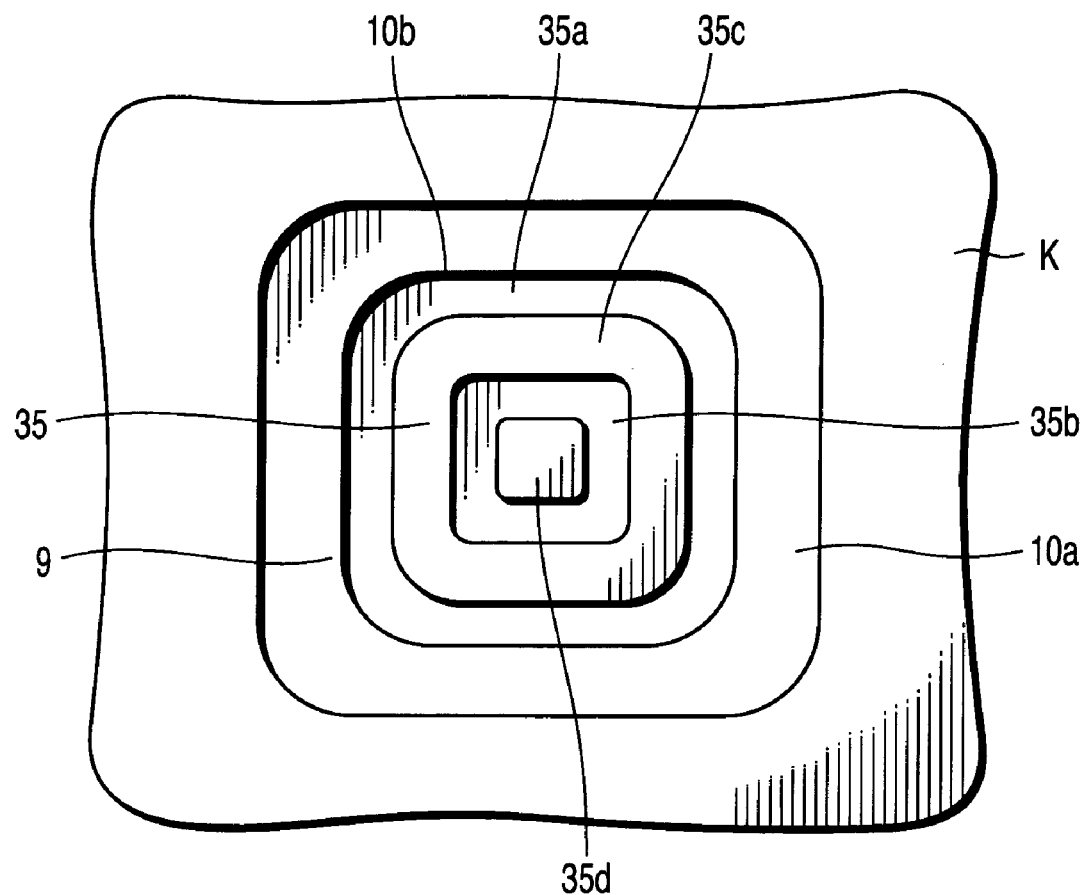
FIG. 18 is a plan view showing a third modification to the holding recess of the card base.
Figure 19:
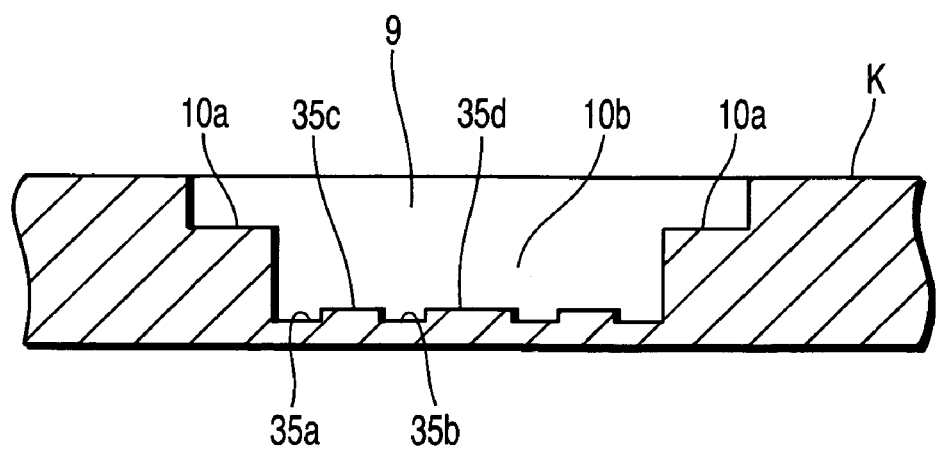
FIG. 19 is a sectional side view of the third modification to the holding recess.

FIG. 18 is a plan view of a third modification to the holding recess 9 of the card base K and FIG. 19 is a sectional view of the second modification.

The holding recess 9 of the third modification has an irregularity portion 35 in the inner bottom of the second holding recess 10b. The irregularity portion 35 includes first and second ring-shaped recesses 35a and 35b that are formed in the inner bottom of the second holding recess 10b and first and second projections 35c and 35d that are formed in accordance with the first and second recesses 35a and 35b.

The third modification can also produce the same advantages as those of the first modification.

Figure 20:
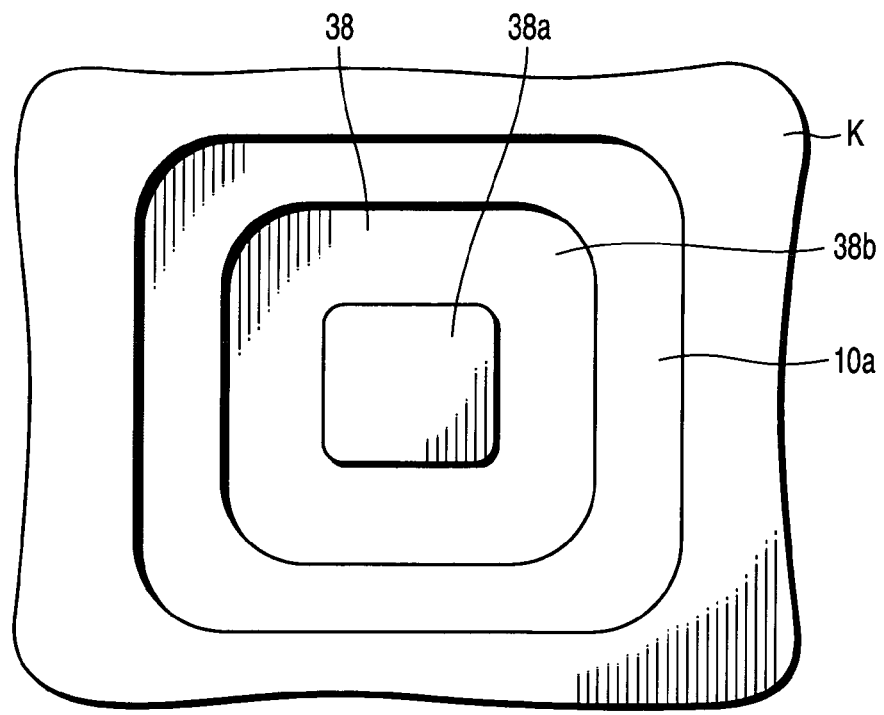
FIG. 20 is a plan view showing a fourth modification to the holding recess of the card base.

FIG. 20 is a plan view of a fourth modification to the holding recess 9 of the card base K.

Figure 21:
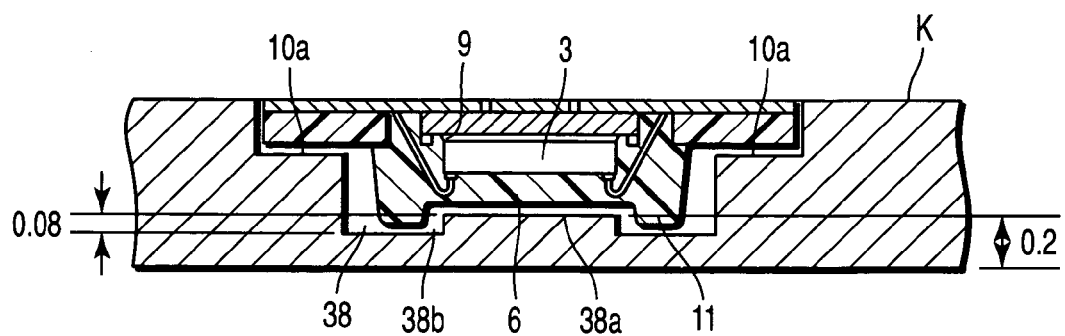
FIG. 21 is a sectional side view of the fourth modification to the holding recess in which the IC module shown in FIG. 4 is held.

The holding recess 9 of the fourth modification has an irregularity portion 38 in the inner bottom of the second holding recess 10b. The irregularity portion 38 includes a rectangular projection 38a that projects from the central part of the inner bottom of the second holding recess 10b and a recess 38b that is formed in accordance with the projection 38a. The IC module 1 as shown in FIG. 4 is held in the holding recess 9 as shown in FIG. 21. In other words, the projection 38a is inserted inside the reinforcing rib 11 of the protection member 6 of the LSI 3.

According to the fourth modification, not only the same advantages as those of the first modification can be obtained, but also the card can be thinned only by inserting the projection 38a inside the reinforcing rib 11.

TABLE 2

RESULTS OF STRENGTH TESTS

| Contents of Evaluation | | Card No. | Shape of Prior Art Plane Breaking Load (N) | Shape of Present Embodiment Formed Rib Breaking Load (N) |
|---|---|---|---|---|
| Evaluation ② | Bending Test on Module Formed as Card | 1 | 20.09 | 24.65 |
| | | 2 | 20.58 | 24.55 |
| | | 3 | 20.97 | 25.07 |
| | | Average | 20.55 | 24.75 |

Table 2 shows results of bending strength tests on the prior art IC module 21 shown in FIG. 28, which is held in the holding recess 9 of the card base K shown in FIG. 3 and formed as a card, and the IC module 1 which is formed as a card as shown in FIG. 21. The thickness of the bottom of the second holding recess 10b of the card base K shown in FIG. 3 is 0.2 mm, while the thickness of the projection 38a of the second holding recess 10b of the card base K shown in FIG. 21 is 0.2 mm and the depth of the recess 38b is 0.08 mm.

Three tests on each of the above prior art card and the card shown in FIG. 21 were conducted and an average of the tests was taken. The breaking load of the prior art card in the first test was 20.09N, that in the second test was 20.58N and that in the third test was 20.97N, and the average of these breaking loads was 20.55N. On the other hand, the breaking load of the card shown in FIG. 21 in the first test was 24.65N, that in the second test was 24.55N and that in the third test was 25.07N, and the average of these breaking loads was 24.76N.

As is evident from the above results, the card shown in FIG. 21 is more improved in strength than the prior art card.

Figure 22:
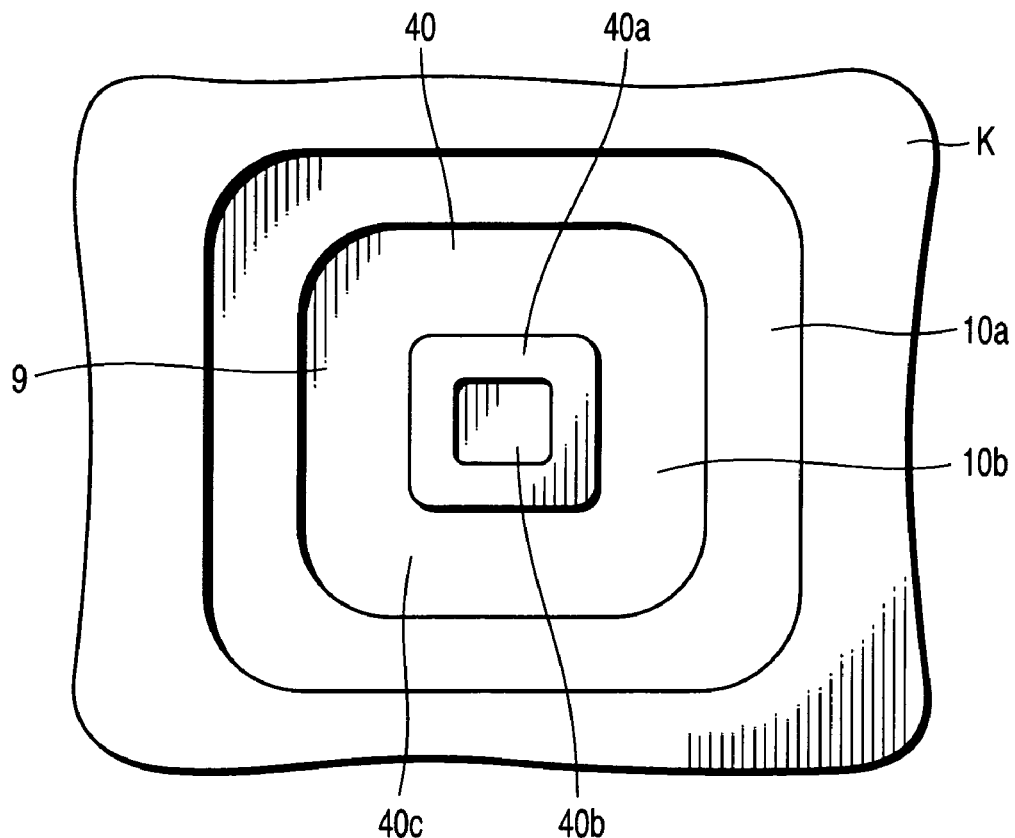
FIG. 22 is a plan view showing a fifth modification to the holding recess of the card base.

FIG. 22 is a plan view of a fifth modification to the holding recess 9 of the card base K.

The holding recess 9 of the fifth modification has an irregularity portion 40 in the inner bottom of the second holding recess 10b. The irregularity portion 40 includes a rectangular frame-like projection 40a and recesses 40b and 40c that are formed in accordance with the projection 40a.

Figure 23:
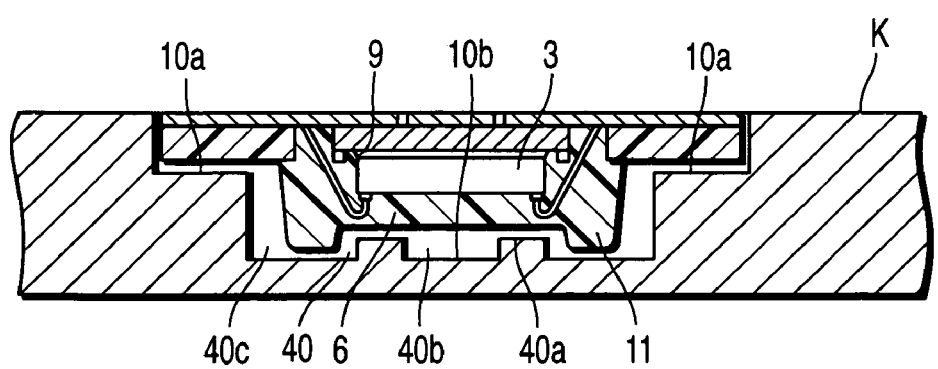
FIG. 23 is a sectional side view of the fifth modification to the holding recess in which the IC module shown in FIG. 4 is held.

The projection 40a is inserted inside the reinforcing rib 11 of the protection member 6 of the LSI 3 as shown in FIG. 23.

The fifth modification can also produce the same advantages as those of the fourth modification.

Figure 24:
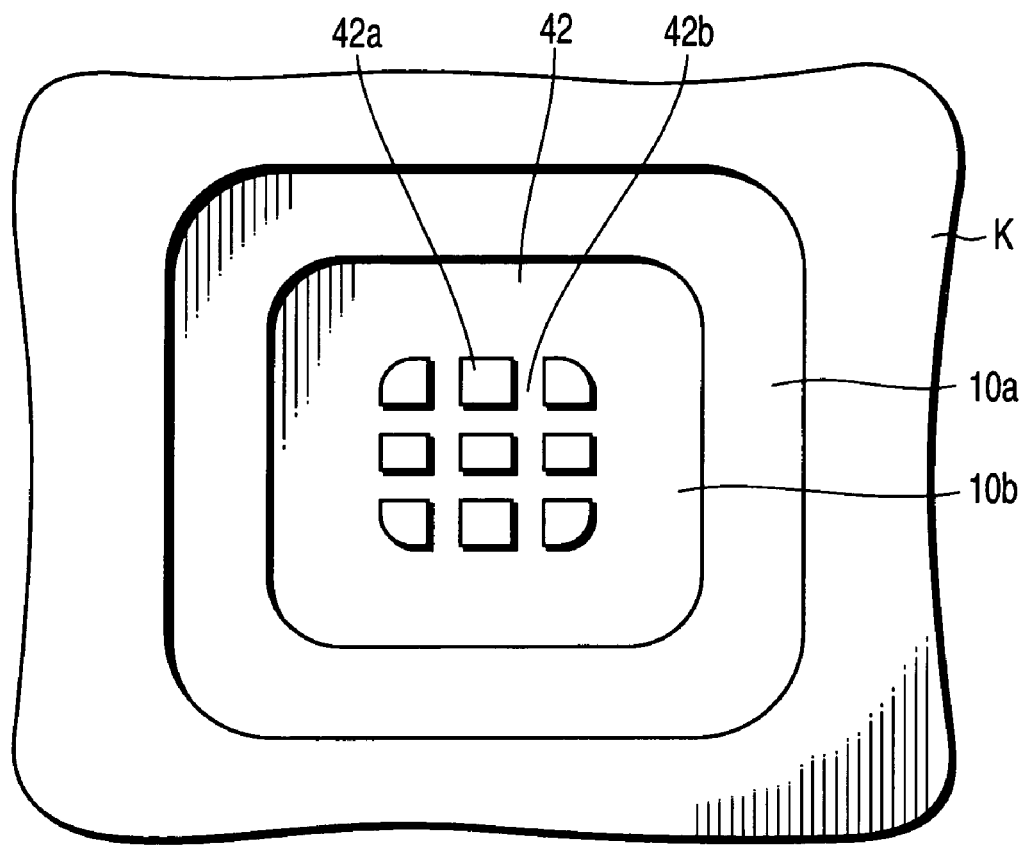
FIG. 24 is a plan view showing a sixth modification to the holding recess of the card base.
Figure 25:
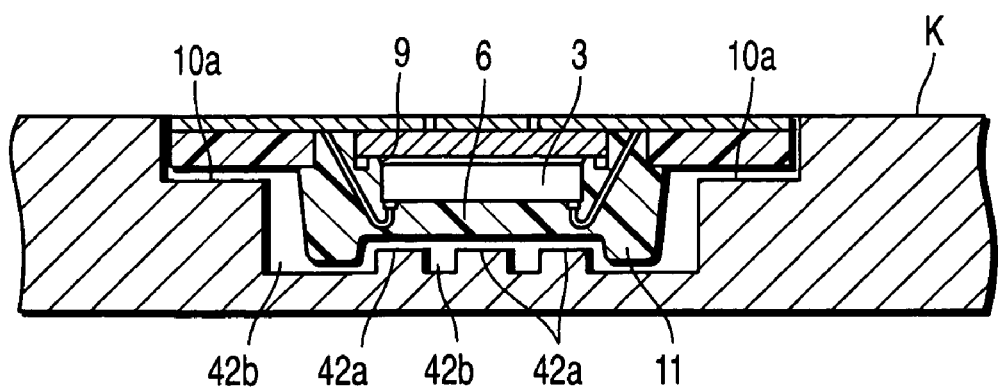
FIG. 25 is a sectional side view of the sixth modification to the holding recess in which the IC module shown in FIG. 4 is held.
Figure 26:
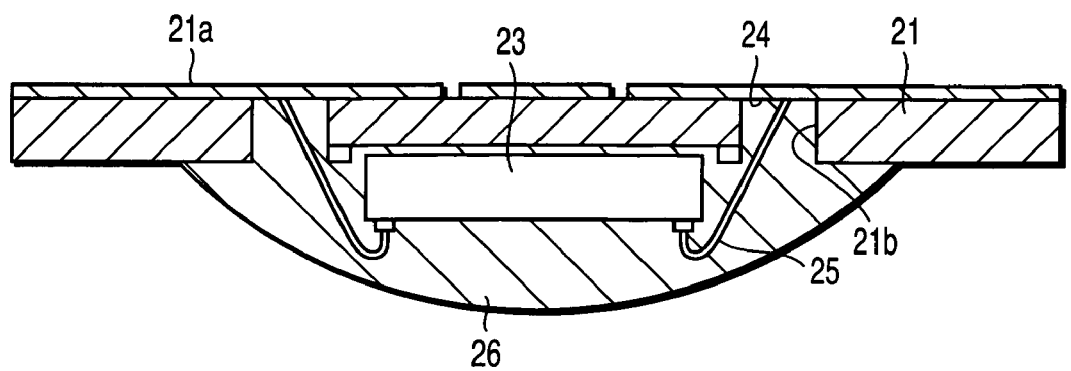
FIG. 26 is a sectional view showing a first prior art IC module.
Figure 27:
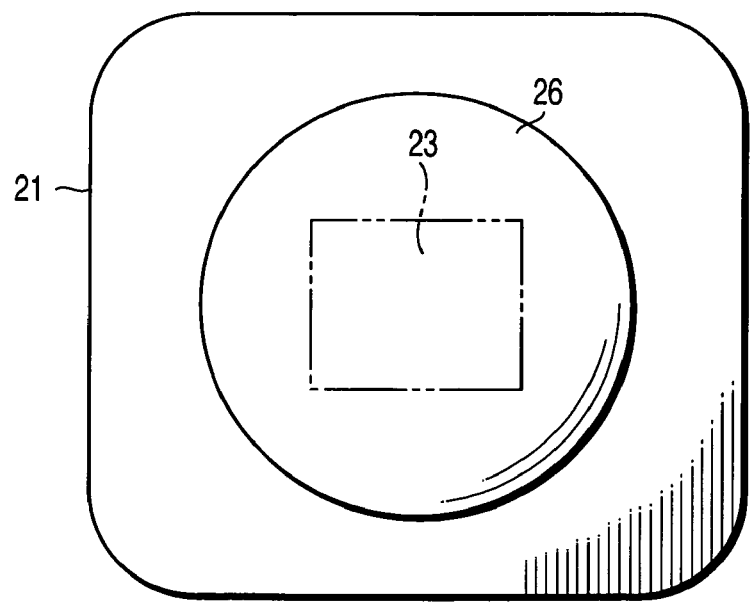
FIG. 27 is a diagram of the first prior art IC module viewed from the arrow in FIG. 26.

FIG. 24 is a plan view of a sixth modification to the holding recess 9 of the card base K.

The holding recess 9 of the sixth modification has an irregularity portion 42 in the inner bottom of the second holding recess 10b. The irregularity portion 42 includes a plurality of projections 42a that are formed vertically and horizontally in the central part of the inner bottom of the second holding recess 10b and recesses 42b that are formed in accordance with the projections 42a. The projections 42a are inserted inside the reinforcing rib 11 of the protection member 6.

The sixth modification can also produce the same advantages as those of the fourth modification.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A portable electronic device comprising:
    a card base having a holding recess;
    an IC module having a substrate, a large scale integration (LSI) mounted on the substrate, a protection member which covers the LSI, the IC module being held in the holding recess from the protection member, a contact terminal provided on the substrate, and a connection member one end of which is electrically connected to the contact terminal and another end of which is electrically connected to the LSI to form a loop; and
    an irregular surface defined by a projected portion, which is integral with the protection member, which is formed on a surface of the protection member, and which is made of the same material as the protection member, the irregular surface opposing an inner bottom of the holding recess when the IC module is held in the holding recess, and the projected portion covering the loop of the connection member.

2. The portable electronic device according to claim 1, wherein the projected portion is rectangular frame shaped.

3. The portable electronic device according to claim 2, wherein a lattice-shaped projection is formed inside the projected portion shaped rectangular frame.

4. The portable electronic device according to claim 1, wherein the projected portion is circular frame shaped.

5. A portable electronic device comprising:
    a card base having a holding recess;
    an IC module having a substrate, a large scale integration (LSI), one surface of which is mounted on one surface of the substrate, a contact terminal provided on other surface of the substrate, a connection member one end of which is electrically connected to the contact terminal and other end of which is electrically connected to other surface of the LSI to form a loop, and a protection member which covers the LSI and the connection member, the IC module being held in the holding recess of the card base from the protection member; and
    an irregular surface defined by a projected portion, which is integral with the protection member, which is formed on a surface of the protection member, and which is made of the same material as the protection member, the irregular surface opposing an inner bottom of the holding recess when the IC module is held in the holding recess, and the projected portion covering the loop of the connection member.

6. The portable electronic device according to claim 5, wherein the projected portion is rectangular frame shaped.

7. The portable electronic device according to claim 6, wherein a lattice-shaped projection is formed inside the projected portion shaped rectangular frame.

8. A portable electronic device comprising:
a card base having a first holding recess, a second holding recess formed in an inner bottom of the first holding recess, and an irregular portion formed in an inner bottom of the second holding recess; and
an IC module having a substrate, a large scale integration (LSI) mounted on the substrate, a protection member which covers the LSI, an irregular surface defined by a projected portion, which is integral with the protection member, which is formed on a surface of the protection member, and which is made of the same material as the protection member, the protection member partly opposing the projected portion of the irregular portion formed in the inner bottom of the second holding recess when the substrate is held in the first holding recess and the protection member being inserted in the second holding recess, a contact terminal provided on the substrate, and a connection member one end of which is electrically connected to the contact terminal and another end of which is electrically connected to the LSI to form a loop, the projected portion covering the loop of the connection member.

9. The portable electronic device according to claim 8, wherein the irregular portion has a plurality of circular recesses.

10. The portable electronic device according to claim 8, wherein the irregular portion has a lattice-shaped recess.

11. The portable electronic device according to claim 8, wherein the irregular portion has a ring-shaped circular recess.

12. A portable electronic device comprising:
a card base having a first holding recess, a second holding recess formed in an inner bottom of the first holding recess, and an irregular portion formed in an inner bottom of the second holding recess;
an IC module having a substrate, a large scale integration (LSI) mounted on the substrate, and a protection member which covers the LSI, the substrate being held in the first holding recess and the protection member being inserted in the second holding recess; and
an irregular surface defined by a projected portion, which is integral with the protection member, which is formed on a surface of the protection member, and which is made of the same material as the protection member, the irregular surface engaging with the irregular portion formed in the inner bottom of the second holding recess when the protection member is held in the second holding recess.

13. The portable electronic device according to claim 12, wherein the projected portion of the irregular surface is rectangle shaped.

14. The portable electronic device according to claim 12, wherein the projected portion of the irregular surface is rectangular frame shaped.

15. The portable electronic device according to claim 12, wherein, the irregular portion has a plurality of projections.

* * * * *